United States Patent
Fisher

(10) Patent No.: US 6,184,690 B1
(45) Date of Patent: Feb. 6, 2001

(54) POLE TO POLE SURGE TEST FOR WOUND PRODUCTS

(75) Inventor: James Allan Fisher, Kettering, OH (US)

(73) Assignee: Fisher Data Products, Inc., Kettering, OH (US)

(*) Notice: Under 35 U.S.C. 154(b), the term of this patent shall be extended for 0 days.

(21) Appl. No.: 09/229,383

(22) Filed: Jan. 11, 1999

(51) Int. Cl.[7] .................................................. G01R 31/06
(52) U.S. Cl. ........................................ 324/546; 324/547
(58) Field of Search ........................... 324/547, 546, 324/772, 545, 541, 529

(56) References Cited

U.S. PATENT DOCUMENTS

| | | | |
|---|---|---|---|
| 2,640,100 | * 5/1953 | Packer et al. | 324/545 |
| 3,932,811 | 1/1976 | Branch | 224/546 |
| 4,849,690 | 7/1989 | Hughes | 324/772 |
| 5,252,915 | 10/1993 | Sedding et al. | 324/772 |
| 5,256,977 | 10/1993 | Domenichini et al. | 324/546 |
| 5,694,044 | 12/1997 | Crowley et al. | 324/546 |
| 5,907,244 | * 5/1999 | Crabill et al. | 324/546 |

FOREIGN PATENT DOCUMENTS 0 085 481    8/1983    (EP) .

* cited by examiner

Primary Examiner—Safet Metjahic
Assistant Examiner—James C Kerveros
(74) Attorney, Agent, or Firm—King & Schickli PLLC

(57) ABSTRACT

A testing surge tests all of the individual coils within a coil assembly or multi-coil winding simultaneously. A pickup device is positioned adjacent each of the coils being tested. A voltage pulse is applied across the multi-coil winding. Each of the pickup devices generates a signal having a waveform representative of the magnetic field generated by the coil adjacent thereto in response to the voltage pulse. These signals are compared to each other to identify insulation defects, winding defects and polarity problems within the coils.

21 Claims, 4 Drawing Sheets

POLE TO POLE SURGE TEST FOR WOUND PRODUCTS

BACKGROUND OF THE INVENTION

The present invention relates in general to testing of multi-coil electric components, often referred to herein as multi-coil windings, which have a plurality of series connected wound coils with the individual coils being inaccessible, and, more particularly, to testing individual coils of such multi-coil windings to improve testing sensitivity. While the invention is generally applicable to multi-coil windings, it will be described herein with reference to testing motor stators for insulation defects, winding defects, reversed polarity of poles and the like for which it is being used initially.

A common procedure for determining various defects in multi-coil windings is known as a "surge test." An apparatus for performing a surge test is illustrated in FIG. 1, wherein a high voltage pulse is applied to a multi-coil winding 10, for example a stator, by charging a capacitor 12 via a capacitor charging circuit 22 and then activating a firing circuit 24 to connect the charged capacitor 12 across the multi-coil winding 10 through a high voltage silicon controlled rectifier (SCR) 14. The high voltage 26 on the capacitor 12, shown in FIG. 2, creates an oscillation within the circuit including a resistance 8, the winding 10 and the capacitor 12. The resistance 8 represents resistance of the winding 10, wiring within the circuit and any additional resistance which may be provided to prevent excessive current flow within the circuit. The damped oscillating waveform created by the excited resistor-inductor-capacitor (RLC) circuit is measured across the winding 10 and shown in FIG. 2.

The damped oscillating waveform created by the excited RLC circuit is measured across the series combination of the individual coils, or poles of a stator, of the multi-coil winding by a measurement circuit 20 shown in FIG. 1 since the individual coils or poles are inaccessible. Analysis of the resulting waveform is used to detect any faults that may be present in one or more of the coils. In the case of a stator comprising a plurality of series connector coils, the analysis is best performed by comparison to stators which are known to be good since tolerances in the wire used to form the coils and the coil winding process itself makes comparison to an ideal standard stator effectively impossible.

Unfortunately, even when comparisons are made to a known good stator, if a stator has a large number of coils, contributions to the waveform from one or a small number of defective coils which indicate a stator fault may be "washed out" by contributions to the waveform from the remaining non-defective coils. In addition, relatively wide test acceptance ranges must be set to accommodate the normal process tolerances and resulting variations in waveforms or data from good multi-coil windings so that marginally defective windings are passed without detection. Several factors must be considered when specifying acceptable limits for production testing, such as wire variation, lamination quality, tolerance of process equipment and tolerance of test equipment. The combination of these factors make it difficult for manufacturers to specify surge test limits that will identify defective coils within multi-coil windings having large numbers of coils much less marginally defective coils.

Accordingly, there is a need for improved testing of multi-coil electrical components having a plurality of series connected coils, such as stators. Preferably, such improved testing would provide greater sensitivity to defects within such multi-coil windings without sacrificing yield and provide simplified and more uniform specification of acceptable test limits.

SUMMARY OF THE INVENTION

The present invention meets this need by providing a method and an apparatus for surge testing all of the individual coils within a coil assembly or multi-coil winding simultaneously. A pickup device is positioned adjacent each of the coils being tested. A voltage pulse is applied across the multi-coil winding. Each of the pickup devices generates a signal having a waveform representative of the magnetic field generated by the coil adjacent thereto in response to the voltage pulse. These signals are compared to each other to identify insulation defects, winding defects and polarity problems within the coils.

According to a first aspect of the present invention, an apparatus for testing a coil assembly comprising a plurality of series connected coils is provided. The plurality of coils extend between first and second ends of the coil assembly. The testing apparatus comprises a capacitor, a charging circuit, a switching circuit, at least one pickup device and a processor. The capacitor includes first and second terminals with the first terminal being connectable to the first end of the coil assembly. The charging circuit is coupled to the capacitor for charging the capacitor. The switching circuit includes a first terminal coupled to the second terminal of the capacitor and a second terminal coupled to the second end of the coil assembly. A voltage pulse from the capacitor is therefore applied across the coil assembly upon activation of the switching circuit. The pickup device is positioned generally adjacent to one of the plurality of coils generating a signal having a waveform representative of a magnetic field generated by the selected coil in response to the voltage pulse. The processor is configured to receive the signal from the pickup device and programmed to control the charging circuit and the switching circuit. The processor is further programmed to analyze the signal to evaluate the coil.

According to another aspect of the present invention, an apparatus for testing a coil assembly comprising a plurality of series connected coils is provided. The plurality of coils extend between first and second ends of the coil assembly. The testing apparatus comprises a capacitor, a charging circuit, a switching circuit, a plurality of pickup devices and a processor. The capacitor includes first and second terminals with the first terminal being connectable to the first end of the coil assembly. The charging circuit is coupled to the capacitor for charging the capacitor. The switching circuit includes a first terminal coupled to the second terminal of the capacitor and a second terminal coupled to the second end of the coil assembly. A voltage pulse from the capacitor is applied across the coil assembly upon activation of the switching circuit. Each of the pickup devices is positioned generally adjacent to a respective one of the plurality of coils generating a signal having a waveform representative of a magnetic field generated by the respective coil in response to the voltage pulse. The processor is configured to receive the signals from each of the plurality of pickup devices and programmed to control the charging circuit and the switching circuit. The processor is further programmed to analyze the signals to evaluate each of the respective coils.

The plurality of pickup devices are preferably housed within a test fixture that may be positioned around or within the coil assembly. The pickup devices are preferably coils or Hall effect sensors. Preferably, the processor is programmed to identify insulation defects or winding defects in the plurality of coils by comparing the signals relative to one another. The processor may also be programmed to compare phase relationships between coils to verify the coils have correct polarities.

According to yet another aspect of the present invention, a method of testing a coil assembly having a plurality of series connected coils comprises applying a voltage pulse across the coil assembly. At least one pickup device positioned generally adjacent to one of the plurality of coils is monitored as the pickup device generates a signal having a waveform representative of a magnetic field generated by the selected coil in response to the voltage pulse.

The step of monitoring the pickup device may comprise monitoring a first pickup device positioned generally adjacent to a first coil of the plurality of coils for a first signal having a waveform representative of a magnetic field generated by the first coil in response to the voltage pulse and monitoring a second pickup device positioned generally adjacent to a second coil of the plurality of coils for a second signal having a waveform representative of a magnetic field generated by the second coil in response to the voltage pulse. The method may further comprise the step of evaluating the first coil and the second coil by comparing the first signal with the second signal. Evaluation of the first and second coils may comprise determining an insulation defect or winding defect of the first coil and the second coil based on the comparison.

The first and second coils may form a coil pair having defined polarities relative to one another with phase relationships between the first and second signals being compared to verify that the first and second coils have the defined correct polarities. The defined polarities may be opposite one another with the first coil and the second coil being adjacent to one another. Alternatively, the defined polarities may be the same as one another with the first coil and the second coil being separated from one another by at least one intervening coil.

The step of monitoring at least one pickup device positioned generally adjacent to one of the plurality of coils may comprise the step of monitoring each of a plurality of pickup devices positioned generally adjacent to respective ones of the plurality of coils with each of the plurality of pickup devices generating a signal having a waveform representative of a magnetic field generated in each respective coil. The method may further comprise the step of evaluating each of the plurality of coils by comparing the signal from each of the plurality of pickup devices with at least one other signal from one of the other pickup devices. Evaluation of each of the plurality of coils may comprise determining an insulation defect and a winding defect of each of the plurality of coils based on the comparisons. The step of evaluating each of the plurality of coils may comprise comparing phase relationships between signals from pairs of coils having defined polarities to verify the pairs of coils are correctly poled. The defined polarities may be opposite one another with the pairs of coils being adjacent to one another. Alternatively, the defined polarities may be the same as one another with the pairs of coils being separated from one another by an intervening coil. The plurality of pickup devices are preferably housed within a test fixture that is preferably positioned either around the coil assembly or within the coil assembly.

Accordingly, it is an object of the present invention to provide a multi-coil winding or coil assembly diagnostic test which more rapidly tests coil assemblies and also has increased sensitivity to defects within coils of the coil assembly. Other features and advantages of the invention will be apparent from the following description, the accompanying drawings and the appended claims.

DETAILED DESCRIPTION OF THE INVENTION

Figure 1:
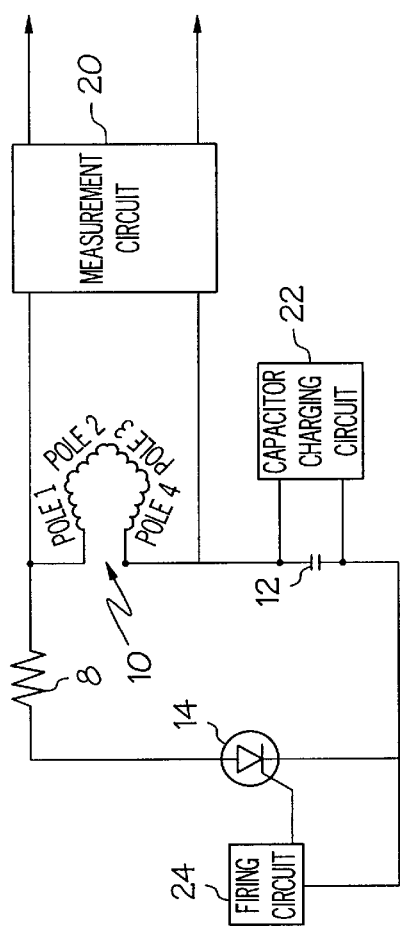
FIG. 1 is a schematic block diagram of a prior art coil surge testing circuit.
Figure 2:
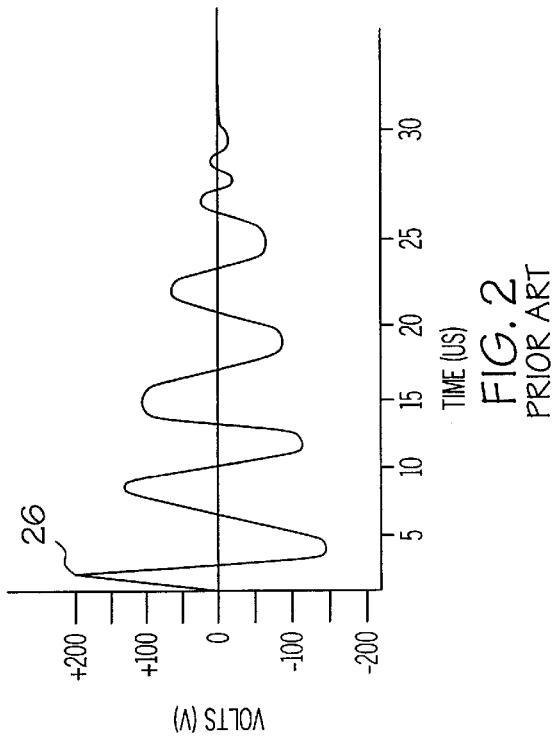
FIG. 2 is graph displaying voltage versus time for a response generated by applying a voltage pulse from a charged capacitor to a good coil of a coil assembly.
Figure 3:
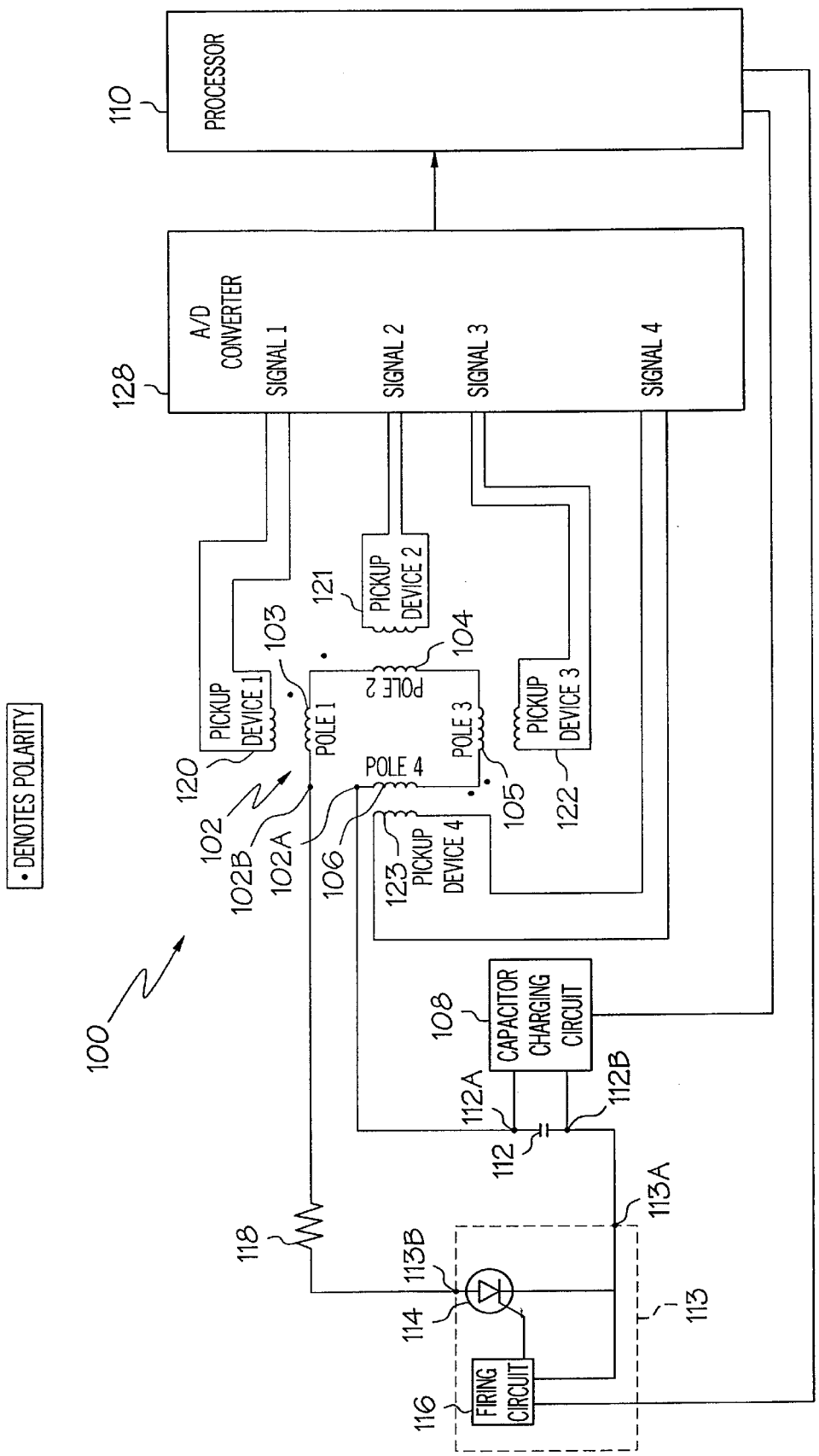
FIG. 3 is a schematic block diagram of the coil surge testing circuit of the present invention.

While the invention is generally applicable to the testing of multi-coil electric components, often referred to herein as multi-coil windings or a coil assembly, it will be described herein with reference to testing motor stators for insulation defects, winding defects, reversed polarity of poles and the like for which it is being used initially. A testing circuit 100 operable in accordance with the present invention is illustrated in FIG. 3. A coil assembly 102 to be tested includes a plurality of series connected wound coils 103, 104, 105 and 106 with the individual coils being inaccessible. Each of the coils 103–106 include a series of windings (not shown) that are also inaccessible. The windings forming the coils 103–106 are wound so that they alternate in direction from one coil to the next thereby causing the polarity of the coils to alternate accordingly. Such a configuration of the coils 103–106 is illustrated in FIG. 3 with the position of the "dot" denoting the polarity of the coil. While the present invention is described relative to a coil assembly having four coils with alternating polarities, it will be appreciated by those skilled in the art that the present invention is applicable to coil assemblies having any reasonable number of coils and desired configurations.

A charging circuit 108, is controlled by a processor 110. The charging circuit 108 charges a capacitor 112. A first terminal 112A of the capacitor 112 is coupled to a first end 102A of the coil assembly 102 which corresponds to a first end of the coil 106. A second terminal 102B of the capacitor 102 is coupled to a first terminal 113A of a switching circuit 113. A second terminal 113B of the switching circuit 113 is coupled to a second end 102B of the coil assembly 102 which corresponds to a first end of the coil 103. The coils 103–106 therefore extend between the first and second ends 102A, 102B of the coil assembly 102.

The switching circuit 113 comprises a silicon controlled rectifier (SCR) 114 and a firing circuit 116. The SCR 114 is actuated by the firing circuit 116 in response to a control signal from the processor 110 to connect the capacitor 112 across the coil assembly 102. A voltage pulse from the capacitor 112 is applied across the coil assembly 102 upon activation of the switching circuit 113 resulting in an oscillating discharge current flowing through the RLC circuit comprising resistor 118, coils 103–106 and capacitor 112. The resistor 118 represents resistance of the coils 103–106, wiring within the circuit and any additional resistance which may be provided to prevent excessive current flow within the circuit. A corresponding oscillating magnetic field is generated in each of the coils 103–106 as a result of the oscillating discharge current.

The magnetic field generated in each of the coils 103–106 is sensed by respective pickup devices 120, 121, 122 and 123 positioned generally adjacent to the coils 103–106. The pickup devices 120–123 are thus able to measure the magnetic field in each of the otherwise inaccessible coils 103–106 directly.

Figure 4:
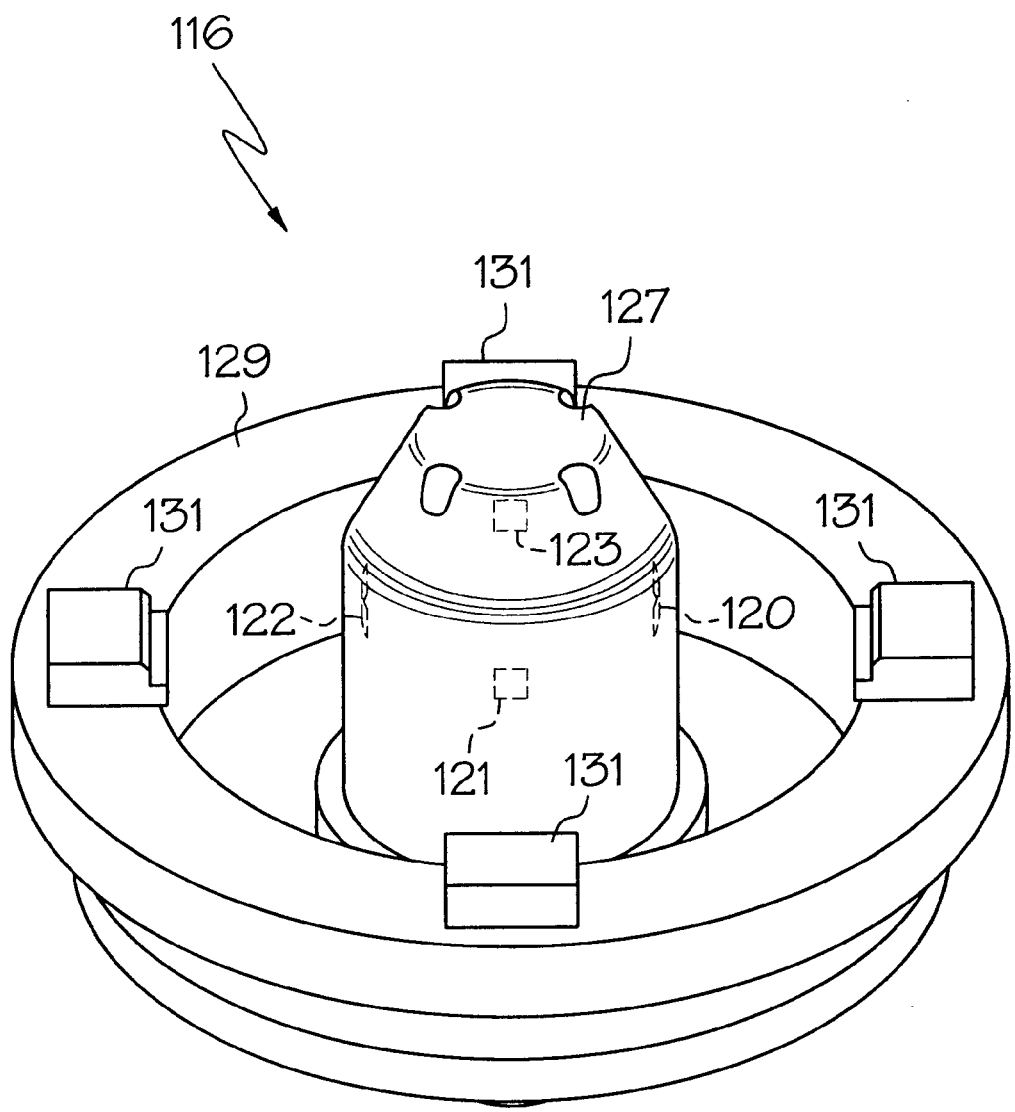
FIG. 4 illustrates a test fixture for the pickup devices illustrated schematically in FIG. 3.
Figure 5A:
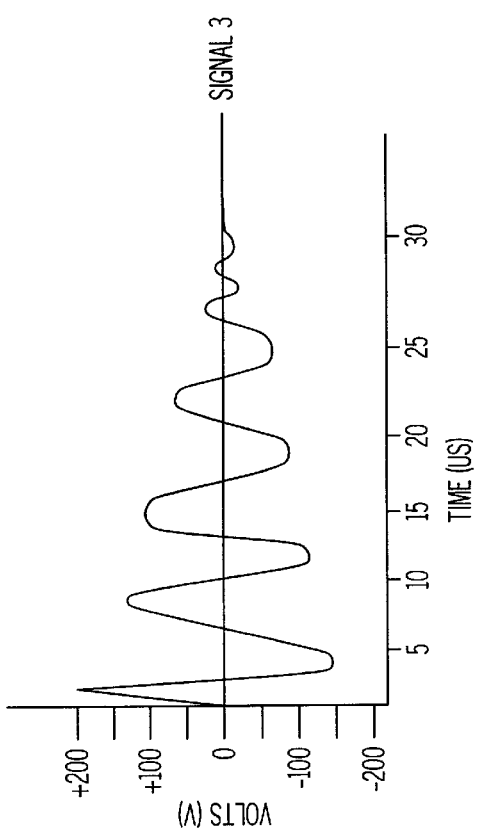
FIGS. 5A–5D are graphs displaying voltage versus time for a response generated by applying a voltage pulse from a charged capacitor to the coils of the coil assembly illustrated in FIG. 3.
Figure 5B:
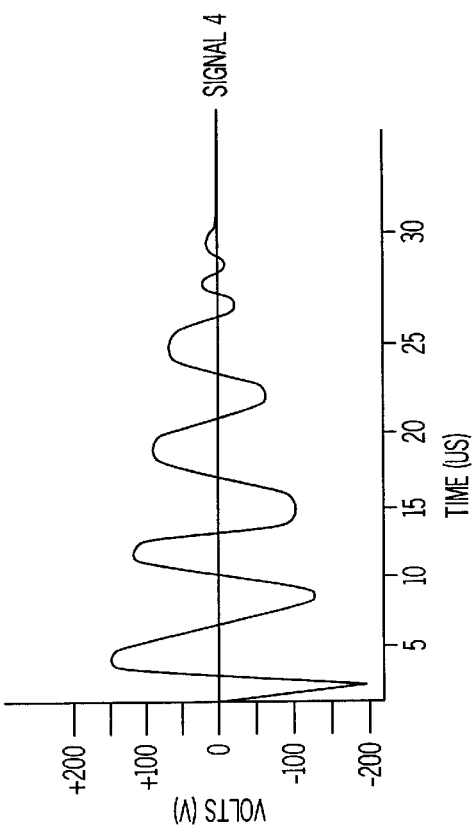
Figure 5C:
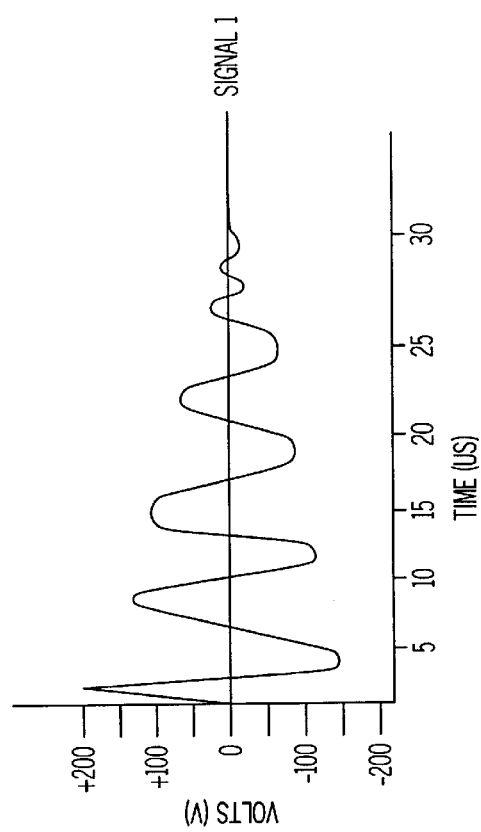
Figure 5D:
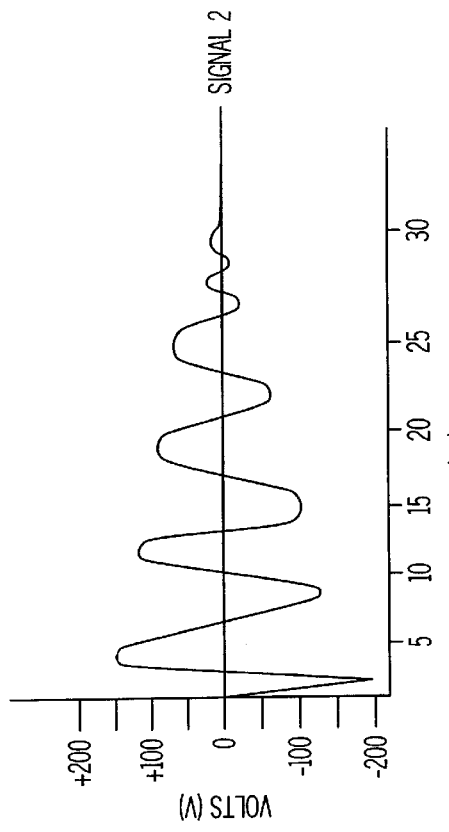

As shown in FIG. 4, the pickup devices 120–123 form part of a test fixture 126. The coil assembly 102 is placed around the test fixture 126 so that the coils 103–106 form a ring around the pickup devices 120–123 for easy testing. However, it will be appreciated by those skilled in the art that the test fixture 126 may be configured so that he test fixture 126 is placed around the coil assembly 102 with the pickup devices 120–123 forming a ring around the coils 103–106. As shown in FIG. 4, the pickup devices 120–123 are mounted on a circuit board (not shown) that is housed within a dome shaped protective structure 127. The dome shaped protective structure 127 is coupled to a fixture ring 129. The fixture ring 129 includes a plurality of location blocks 131 upon which the coil assembly 102 is mounted and about which each of the coils 102–106 are aligned. The test fixture 126 may function as a standalone stand providing support for the coil assembly 102 or it may be incorporated into a testing table (not shown). Lead wires (not shown) from each of the pickup devices 120–123 are routed through the bottom of the dome shaped protective structure 127. The dome shaped protective structure 127 and the fixture ring 129 are preferably formed of nonconductive material so as not to interfere with the magnetic field generated by each of the coils 103–106 during testing.

The pickup devices 120–123 are sensitive to the effects of the magnetic field generated by the pulsed coils 103–106 and may include a coil, Hall effect sensor, and the like. Each of the pickup devices 120–123 generates a signal having a waveform representative of the magnetic field generated in the respective coil. Representative waveforms for each of the coils 103–106 are illustrated in FIGS. 5A–5D. The signals from the pickup devices 120–123 are converted to digital signals and multiplexed together into a single signal by an A/D convertor 128 for processing by the processor 110. It will be appreciated by those skilled in the art that the processor 110 may include a built-in A/D convertor for converting the signals from the pickup devices 120–123 for processing. It will be further appreciated by those skilled in the art that the signals may be conditioned or otherwise pre-processed prior to being transmitted to the processor 110.

The processor 110 is programmed to compare the signals in digital form relative to one another to determine if any of individual coils 103–106 are defective or if the coil assembly 102 itself is defective. Specifically, the processor 110 is programmed to identify insulation defects and winding defects in the individual coils 103–106. An insulation defect occurs when one of the windings in the coil is "nicked" or otherwise damaged resulting in a short or reduction in the inductance of the coil compared to the other coils. The absolute value of a waveform from a coil having an insulation defect will not be substantially equivalent to the waveforms from a "good" coil.

A winding defect occurs when the number of windings in a coil are either greater than or less than the intended value or one or more of the windings are positioned in the wrong place. The waveform associated with a coil having a winding defect will not be substantially equivalent to the waveform from a "good" coil. Accordingly, the condition of any one coil may be determined by comparing the waveforms from each of the pickup devices with each other with anomalies being readily apparent. The coils may be evaluated by comparing the signal from the associated pickup device with one or more of the signals from the other pickup devices as desired. To ensure that all defects are detected, a second test may be preformed with the connection of the coil assembly 102 to the testing circuit 100 being reversed.

While not ideal, the processor 110 may be programmed to evaluate each of the coils 103–106 by comparing the signal from each of the pickup devices 120–123 with a master signal. The master signal may be derived from a variety of different methods, for example, by averaging signals associated with a plurality of "good" coils. It will be appreciated by those skilled in the art that some precision is lost by comparing the signals to a master signal since normal tolerances in the wire used to form the coils and the coil winding process itself require sufficient test ranges as a "good" coil will vary from one coil assembly to another.

The processor 110 is also programmed to compare the phase relationships between the coils to verify that the coils have the correct polarity. In the illustrated embodiment, the processor compares the phase relationships between adjacent coils to verify that the coils have opposite polarities. The coil assembly 102 illustrated in FIG. 3 should result in the waveforms from adjacent coils being ninety degrees out-of-phase with one another. Signal 1 is therefore compared to signal 2, signal 2 is compared to signal 3, signal 3 is compared to signal 4 and signal 4 is compared to signal 1. As shown in FIGS. 5A–5D, the waveforms alternate phases in accordance with the alternating polarities of the coils 103–106. Accordingly, the signals from the pickup devices 120–123 are compared to verify that the polarity of the coils 103–106 alternate from one coil to the next. It will be appreciated by those skilled in the art that the signals from selected coil pairs may be compared to verify proper polarity, either opposite polarity or same polarity. For example, the coil pairs may comprise coils adjacent to one another, odd numbered coils, even numbered coils or any desired selection of coils.

The present invention enables otherwise inaccessible coils of a coil assembly to be tested directly and simultaneously. However, it will be appreciated by those skilled in the art that while slower, only one pickup device need be used to test each coil of a coil assembly. In such an arrangement, a voltage pulse would be applied to the coil assembly for each test of a coil with the pickup device being rotated to the next adjacent coil after each measurement until all of the coils have been tested. It should thus be apparent from the aforementioned description that the present invention may therefore be practiced with the number of pickup devices varying anywhere from one to the exact number of coils in the coil assembly.

Having described the invention in detail and by reference to preferred embodiments thereof, it will be apparent that modifications and variations are possible without departing from the scope of the invention defined in the appended claims.

What is claimed is:

1. A method of surge testing a coil assembly comprising a plurality of coils connected in series between a first end of said coil assembly and a second end of said coil assembly, said plurality of coils being inaccessible except via said first and second ends and said method comprises the steps of:

applying a voltage pulse across said first and second ends of said coil assembly;

monitoring at least one pickup device positioned generally adjacent to one of said plurality of coils by performing the steps of:

monitoring a first pickup device positioned generally adjacent to a first coil of said plurality of coils, said first pickup device generating a first signal having a waveform representative of a magnetic field generated by said first coil in response to said voltage pulse;

monitoring a second pickup device positioned generally adjacent to a second coil of said plurality of coils, said second pickup device generating a second signal having a waveform representative of a magnetic field generated by said second coil in response to said voltage pulse; and evaluating said first coil and said second coil by comparing said first signal with said second signal.

2. The method of claim 1, wherein said step of evaluating said first coil and said second coil comprises the step of determining an insulation defect of said first coil and said second coil based on said comparison.

3. The method of claim 1, wherein said step of evaluating said first coil and said second coil comprises the step of determining a winding defect of said first coil and said second coil based on said comparison.

4. The method of claim 1, wherein said first coil and said second coil form a coil pair having defined polarities relative to one another, and wherein said step of evaluating said first coil and said second coil by comparing said first signal with said second signal further comprises the step of comparing phase relationships between said first signal and said second signal to verify said first coil and said second coil have correct polarities.

5. The method of claim 4, wherein said defined polarities are opposite one another and said first coil and said second coil are adjacent to one another.

6. The method of claim 4, wherein said defined polarities are the same as one another and said first coil and said second coil are separated from one another by at least one intervening coil.

7. The method of claim 1, wherein said step of monitoring at least one pickup device positioned generally adjacent to one of said plurality of coils comprises the step of monitoring each of a plurality of pickup devices positioned generally adjacent to respective ones of said plurality of coils, each of said plurality of pickup devices generating a signal having a waveform representative of a magnetic field generated in said respective ones of said plurality of coils.

8. The method of claim 7, further comprising the step of evaluating each of said plurality of coils by comparing said signal from each of said plurality of pickup devices with at least one other of said signals from said plurality of pickup devices.

9. The method of claim 8, wherein said step of evaluating each of said plurality of coils comprises the step of determining an insulation defect or a winding defect of each of said plurality of coils based on said comparisons.

10. The method of claim 8, wherein said step of evaluating each of said plurality of coils comprises the step of comparing phase relationships between signals from pairs of coils having defined polarities to verify said pairs of coils are correctly poled.

11. The method of claim 10, wherein said defined polarities are opposite one another and said pairs of coils are adjacent to one another.

12. The method of claim 10, wherein said defined polarities are the same as one another and said pairs of coils are separated from one another by an intervening coil.

13. The method of claim 7, wherein said plurality of pickup devices are housed within a test fixture, and further comprising the step of positioning said test fixture around said coil assembly.

14. The method of claim 7, wherein said plurality of pickup devices are housed within a test fixture, and further comprising the step of positioning said coil assembly around said test fixture.

15. An apparatus for surge testing a coil assembly comprising a plurality of coils connected in series between a first end of said coil assembly and a second end of said coil assembly, said plurality of coils being inaccessible except via said first and second ends, said apparatus comprising:

a capacitor having first and second terminals, said first terminal of said capacitor being connectable to said first end of said coil assembly;

a charging circuit coupled to said capacitor for charging said capacitor;

a switching circuit having first and second terminals, said first terminal of said switching circuit being coupled to said second terminal of said capacitor, and a second terminal being coupled to said second end of said coil assembly, a voltage pulse from said capacitor being applied across said coil assembly upon activation of said switching circuit;

a plurality of pickup devices, each of said pickup devices positioned generally adjacent to respective ones of said plurality of coils and generating a signal having a waveform representative of a magnetic field generated by said respective one of said plurality of coils in response to said voltage pulse; and a processor programmed to control said charging circuit and said switching circuit, said processor receiving said signals from each of said plurality of pickup devices and further programmed to analyze said signals to evaluate each of respective ones of said plurality of coils by comparing said signal from each of said plurality of pickup devices with at least one other of said signals from said plurality of pickup devices.

16. The apparatus of claim 15, wherein said plurality of pickup devices are housed within a test fixture, said test fixture being positioned around said coil assembly.

17. The apparatus of claim 15, wherein said plurality of pickup devices are housed within a test fixture, said coil assembly being positioned around said test fixture.

18. The apparatus of claim 15, wherein each of said plurality of pickup devices are selected from a coil or a Hall effect sensor.

19. The apparatus of claim 15, wherein said processor is programmed to identify insulation defects in said plurality of coils by comparing said signals relative to one another.

20. The apparatus of claim 15, wherein said processor is programmed to identify winding defects in said plurality of coils by comparing said signals relative to one another.

21. The apparatus of claim 15, wherein said processor is programmed to compare phase relationships between coils to verify said coils have correct polarities.

\* \* \* \* \*